United States Patent
Buckley et al.

(10) Patent No.: US 7,358,877 B1
(45) Date of Patent: Apr. 15, 2008

(54) OBSOLESCENCE MITIGATION FOR ELECTRON BOMBARDED SEMICONDUCTOR TUBES IN PROGRAMMABLE WAVEFORM DIGITIZERS

(75) Inventors: Robert M. Buckley, Medford, NY (US); James McKenna, Bohemia, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days.

(21) Appl. No.: 11/521,223

(22) Filed: Sep. 14, 2006

Related U.S. Application Data

(60) Provisional application No. 60/726,015, filed on Oct. 12, 2005.

(51) Int. Cl.
*H03M 1/10* (2006.01)
(52) U.S. Cl. .................. 341/120; 341/118; 341/155
(58) Field of Classification Search ................. 341/120
See application file for complete search history.

(56) References Cited

U.S. PATENT DOCUMENTS

| | | | | |
|---|---|---|---|---|
| 4,005,408 A | * | 1/1977 | Taylor et al. ................. 341/12 |
| 4,227,187 A | * | 10/1980 | McNamara et al. .......... 341/12 |
| 4,647,909 A | * | 3/1987 | Spalding ..................... 341/122 |
| 5,185,571 A | * | 2/1993 | Brust ......................... 324/751 |
| 6,356,221 B1 | * | 3/2002 | LeChevalier ................ 341/137 |
| 6,480,242 B1 | * | 11/2002 | Okada et al. ............... 348/807 |
| 7,146,283 B2 | * | 12/2006 | Daigle et al. ............... 702/107 |

* cited by examiner

*Primary Examiner*—Khai M. Nguyen
(74) *Attorney, Agent, or Firm*—Brian Roffe

(57) ABSTRACT

Method for replacing Electron Bombarded Semiconductor (EBS) tubes in a waveform digitizer having an analog input interface and a digital output interface, the EBS tubes being interposed between the analog input interface and the digital output interface, in which the EBS tubes and associated circuitry and componentry between the analog input interface and the digital output interface are removed, scalers and low voltage monolithic analog-to-digital converters (ADCs) are coupled to the analog input interface and the digital output interface. The ADCs may be mounted on a printed circuit board. The ADCs and associated circuitry may be designed to provide on-chip calibration and a built-in testing ability.

20 Claims, 4 Drawing Sheets

100

PRIOR ART

PRIOR ART

OBSOLESCENCE MITIGATION FOR ELECTRON BOMBARDED SEMICONDUCTOR TUBES IN PROGRAMMABLE WAVEFORM DIGITIZERS

CROSS-REFERENCE TO RELATED APPLICATION

This application claims priority under 35 U.S.C. §119(e) of U.S. provisional patent application Ser. No. 60/726,015 filed Oct. 12, 2005, incorporated by reference herein.

FIELD OF INVENTION

The present invention relates generally to the field of automatic test equipment for testing electronic signals generated by equipment under test including digitized waveforms. More specifically, the present invention relates to a hardware methodology for replacing obsolete and unmaintainable Electron Bombarded Semiconductor (EBS) Tubes used for analog-digital conversion.

BACKGROUND OF INVENTION

Automatic test equipment for the testing and measurement of electronic signals and waveforms is known. Frequently, existing test instrumentation utilizes hardware components that have become obsolete and unmaintainable. The cost to replace the entire test instrument is typically very high due to its impact on test and software applications. Additionally, maintenance of the test instrument's original designed components to extend service life is limited due to obsolescence and reliability issues experienced with older technology. All these issues prohibit utilization for limited budgeted systems.

In some test instrumentation, Electron Bombarded Semiconductor (EBS) tubes are used for analog-digital conversion. As with other test instrument components, these EBS tubes are also subject to obsolescence.

One methodology used to extend service life and mitigate the issues of obsolescence and reliability is to replace the special Electron Bombarded Semiconductor (EBS) Tubes with current technology that is functionally the same yet reliably superior. By utilizing new technology, the overall cost of maintaining the test instrument is reduced while utilization is enhanced. Applied to multiple systems where the instrument is used, the benefits are profound.

To provide an understanding of the application of the invention, FIG. 1 shows major subsystems of a prior art automatic test equipment capable of measuring waveforms via programmable by digitization. Specifically, FIG. 1 shows a block diagram of an IATS Programmable Waveform Digitizer 100 in which the major functional subsystems, aside from an analog-to-digital conversion subsystem, are shown. One skilled in the art would be readily able to ascertain the manner in which the waveform digitizer 100 operates and the function of each subsystem.

As the invention relates in particular to an analog-to-digital conversion block for such a programmable waveform digitizer 100, the prior art analog-to-digital conversion (ADC) block is shown in FIG. 2 and designated generally as 102. ADC block 102 includes, for each of Channel A Input and Channel B input thereto, an EBS tube 104.

In a manner known to those skilled in the art, the EBS tubes 104 are used to perform analog-to-digital conversion. One special EBS tube for this purpose is an electron tube with a silicon target, an electron gun, focus lenses and alignment plates using a 10-kilovolt beam to convert an input analog signal to a digital format. The tube requires a high voltage supply to develop the 10-kilovolt beam and precise alignment in order to accurately perform the analog-to-digital conversion. Additionally, skilled technical personal are required to periodically perform a detailed calibration procedure.

Each EBS tube 104 interfaces with a deflection amplifier 106 and a clock buffer 108 which provides a strobe for sampling, for example, at five nanosecond intervals (200 Mps) (see FIG. 1). The deflection amplifiers 106 provide analog input for sampling by the EBS tubes 104. A high voltage supply 110 is also provided as either part of the ADC block 102 or one of the subsystems in the programmable waveform digitizer 100. The high voltage power supply 110 provides the voltage required to develop a 10-kilovolt beam to convert an input analog signal into digital form. The programmable waveform digitizer 100 also includes a data memory interface component 112 which receives the Channel A and B data from the ADC block 102. Data memory interface component 112 is typically constructed to be capable of storing 8 bit gray coded outputs.

As discussed above, since the EBS tubes 104 are therefore obsolete, it would be desirable to replace them, and ideally the entire ADC block 102 containing them.

OBJECTS AND SUMMARY OF INVENTION

It is an object of the present invention to provide new and improved automatic test equipment for testing electronic signals generated by equipment under test including digitized waveforms.

It is another object of the present invention to provide a new hardware methodology for replacing obsolete and unmaintainable Electron Bombarded Semiconductor (EBS) tubes used for analog-digital conversion in automatic test equipment.

It is yet another object of the present invention to provide a new method for nullifying the obsolescence of Electron Bombarded Semiconductor (EBS) tubes used for analog-digital conversion in automatic test equipment by replacing the entire analog-to-digital conversion block containing such EBS tubes.

In order to achieve these objects and others, a method for replacing Electron Bombarded Semiconductor (EBS) tubes in a waveform digitizer having an analog input interface and a digital output interface, the EBS tubes being interposed between the analog input interface and the digital output interface, comprises removing the EBS tubes and associated circuitry and componentry between the analog input interface and the digital output interface, and coupling scalers and low voltage monolithic analog-to-digital converters (ADCs) to the analog input interface and the digital output interface.

In some embodiment, the ADCs may be mounted on a printed circuit board which may also includes a scalers arranged so that each ADC is connected to a respective scaler. Furthermore, in some embodiments, the ADCs and associated circuitry may be designed to provide on-chip calibration and a built-in test ability.

In a method for converting analog signals from a waveform digitizer into digital signals in accordance with invention without using EBS tubes, monolithic analog-to-digital converters are coupled to subsystems of the waveform digitizer which provide analog input to the ADCs, and specifically the same subsystems to which the EBS tubes are connected when present, a strobe signal is directed to the ADCs for example from a clock interface or buffer, and upon operation of the ADC's, digital output is generated and provided to a data memory interface. With this construction, the function of EBS tubes in the prior art is conveniently substituted for while disadvantages of the EBS tubes, e.g., obsolescence, are avoided. The same variations to the method above can be applied to this method as well.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
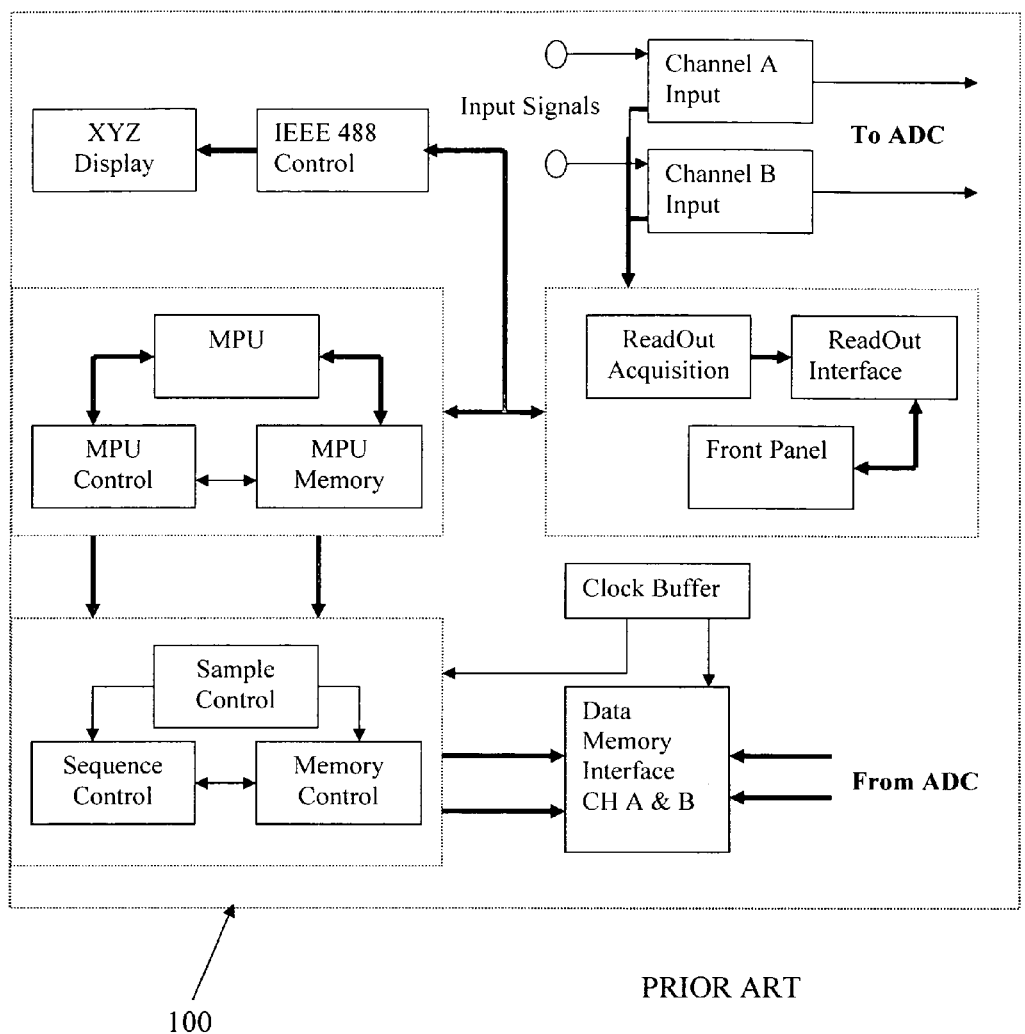
FIG. 1 is a prior art programmable waveform digitizer block diagram of functional subsystems showing input and data arrows for an analog-to-digital conversion subsystem.
Figure 2:
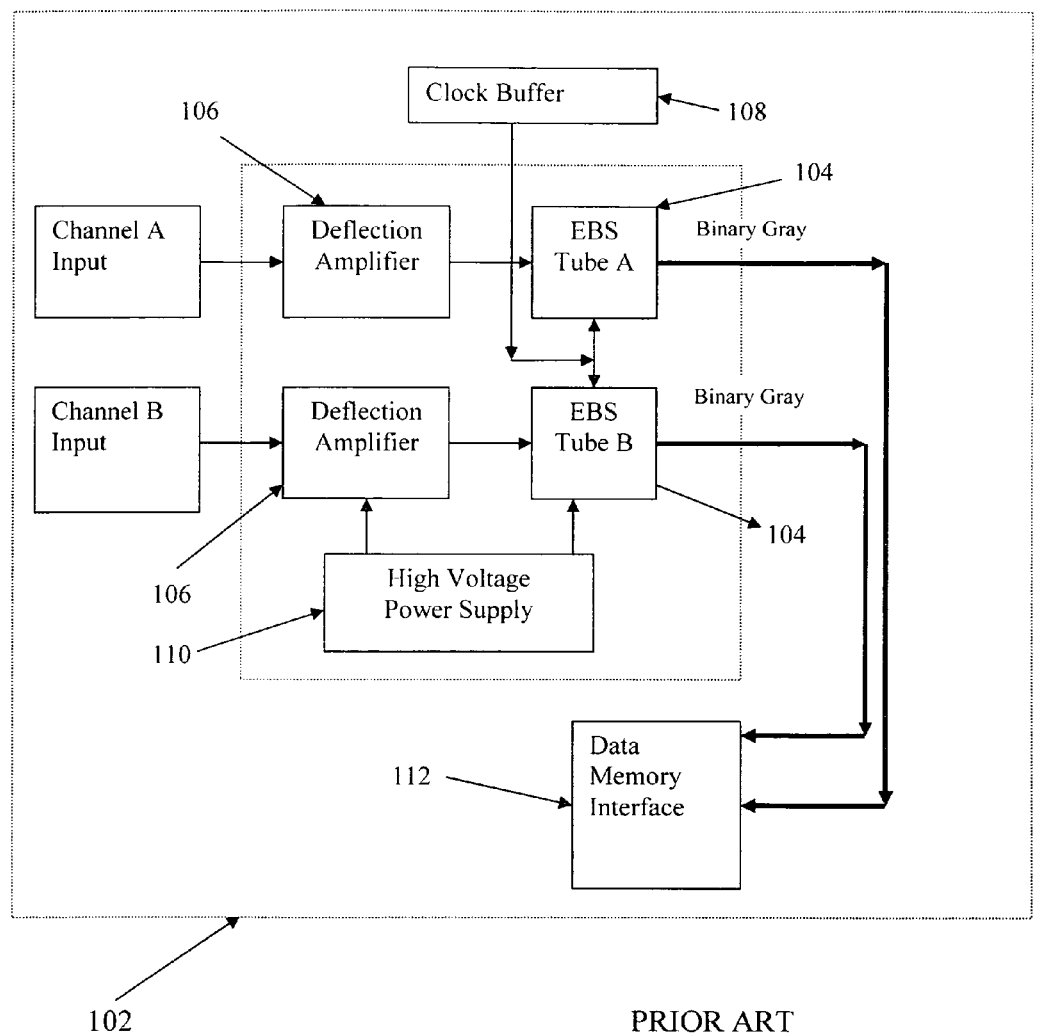
FIG. 2 is a block diagram of an analog-to-digital conversion subsystem using high voltage EBS tubes for use in combination with the subsystems of the programmable waveform digitizer shown in FIG. 1.
Figure 3:
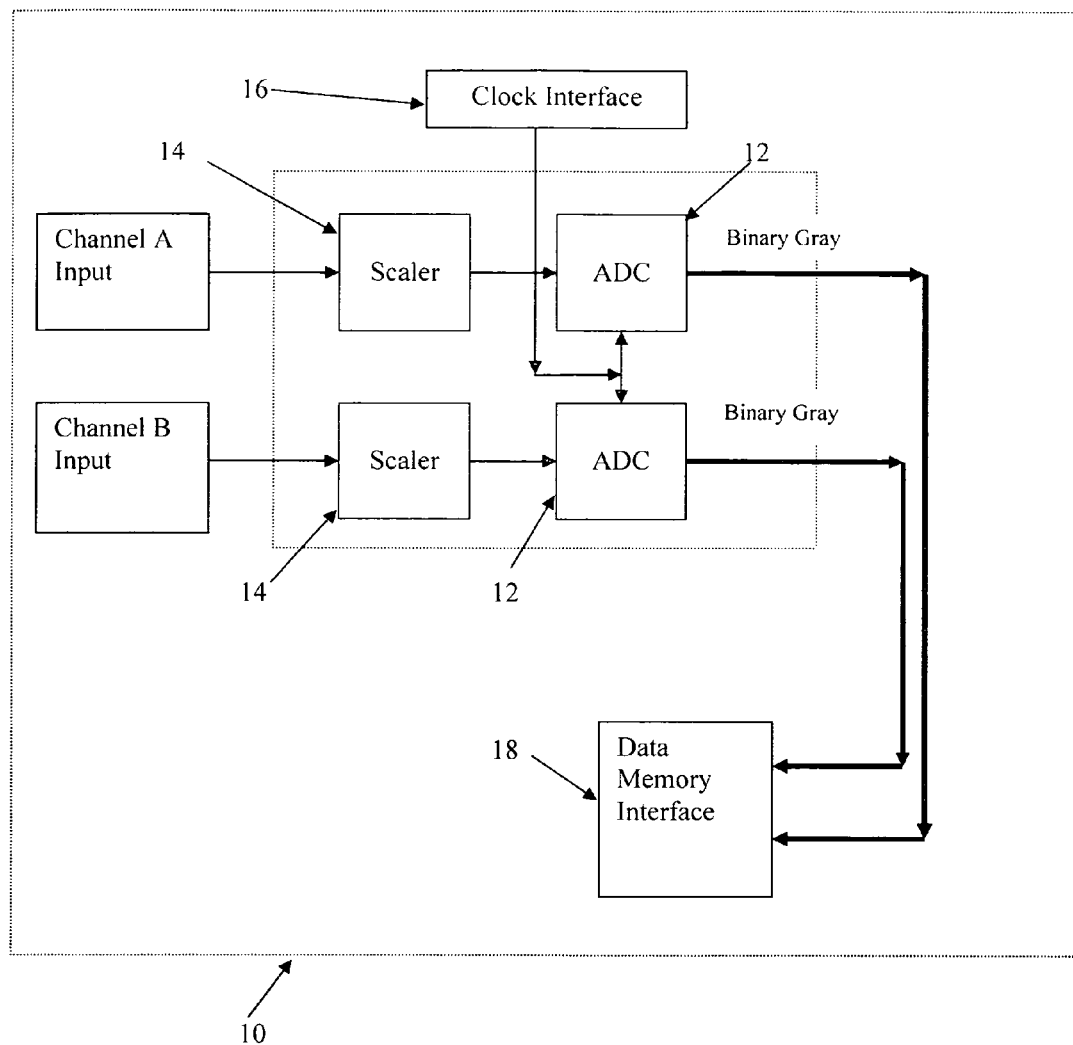
FIG. 3 is a block diagram of an analog-to-digital conversion subsystem in accordance with the invention for use in combination with the subsystems of the programmable waveform digitizer shown in FIG. 1.

Referring to FIG. 3, an analog-to-digital conversion (ADC) block in accordance with the invention for use in combination with the subsystems of the programmable waveform digitizer 100 shown in FIG. 1 is designated generally as 10 and includes components which replace and substitute for the ADC block 102 shown in FIG. 2.

Specifically, the ADC block 10 in accordance with the invention replaces each EBS tube 102 with a monolithic analog-to-digital converter (ADC) 12 and preferably an associated scaler 14. Each scaler 14 establishes a full scale deflection function between the analog input and the ADC 12. Each monolithic ADC 12 is preferably a dual 8 bit ADC which samples at 200 Msps and outputs a digitized signal in gray code format. The ADC 12 provides for on-chip calibration and a Built-In-Test eliminates the need for alignment. The clock and data memory interfaces provide the required logic level translation for communication with their respective subsystem.

Each ADC 12 interfaces with the same subsystems in the waveform digitizer as the replaced EBS tube 102, i.e., a single clock buffer 16 which provides a strobe signal and a respective data memory interface 18 (although only one is shown, either a single data memory interface may be coupled to a plurality of or all of the ADCs 12 or multiple data memory interfaces and/or components provided, one for each ADC 12). In operation, each ADC 12 accepts analog input from the respective scaler 14, a sample clock from a strobe signal provided by the clock buffer 16 and outputs 8 bit gray code data to the respective data memory interface 18. The subsystem signals are either coax or ribbon interfaces that will plug directly into a printed circuit board or comparable component on which the ADCs 12 are mounted, providing for simple retrofit. The ADC printed circuit board directly interfaces to the test instruments' analog and digital interfaces.

As will be evident to one of ordinary skill in the art, the channel inputs can each be directed to a respective amplifier which links to the ADCs 12 via an analog switch. Gain and offset functions can be applied to the signals to and/or from the ADCs 12.

A programmable waveform digitizer including the ADC block 12 in accordance with the invention offers the same performance and accuracy in a low voltage environment with on-chip calibration and Built-In-Test, providing for a highly accurate, reliable and easy to maintain ADC subsystem.

Figure 4:
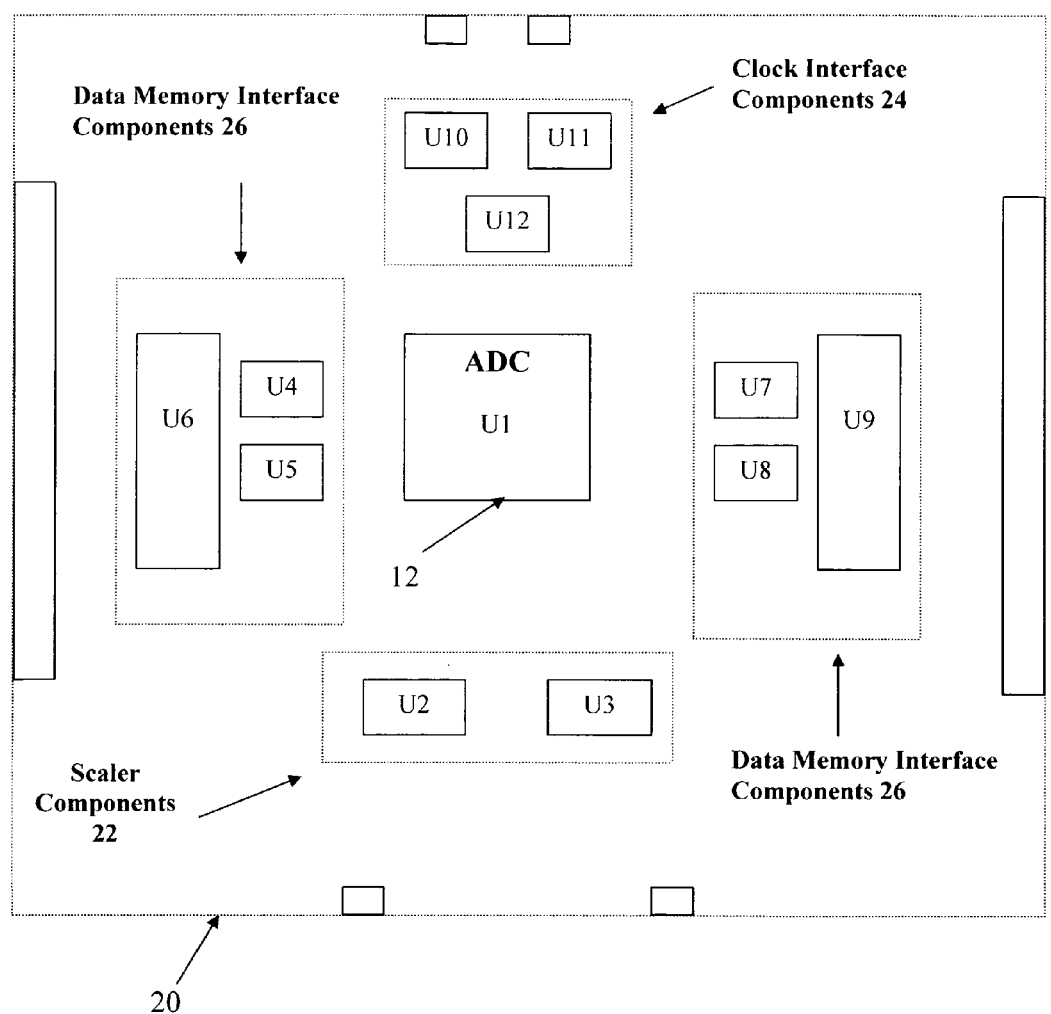
FIG. 4 is a top view of a printed circuit board containing an analog-to-digital conversion subsystem in accordance with the invention.

For example, FIG. 4 shows an exemplifying, non-limiting sketch of a printed circuit board 20 in which the various components of the ADC block 10 in accordance with the invention are schematically illustrated. The printed circuit board 20 includes an ADC 12, scaler components 22, clock interface components 24 and data memory interface components 26. Appropriate electrical wiring connecting the components 12, 22, 24, 26 are also provided but not shown.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. For example, although described primarily in method limitations, the systems shown in FIGS. 3 and 4 can be operative in and of themselves, e.g., as an attachment to or part of a waveform digitizer to render digital output signals.

The invention claimed is:

1. A method for replacing Electron Bombarded Semiconductor (EBS) tubes in a waveform digitizer having an analog input interface and a digital output interface, the EBS tubes being interposed between the analog input interface and the digital output interface, comprising:
    removing the EBS tubes and associated circuitry and componentry between the analog input interface and the digital output interface; and
    coupling scalers and low voltage monolithic analog-to-digital converters (ADCs) to the analog input interface and the digital output interface.

2. The method of claim 1, further comprising mounting the ADCs on a printed circuit board.

3. The method of claim 1, further comprising connecting each ADC to a respective scaler.

4. The method of claim 1, further comprising connecting each ADC to a respective data memory interface.

5. The method of claim 1, further comprising designing the ADCs and associated circuitry to provide on-chip calibration and a built-in testing ability.

6. The method of claim 1, wherein each ADC is a monolithic dual 8 bit ADC.

7. The method of claim 1, further comprising determining the scalers and ADC's to couple to the analog input interface and digital output interface such that the same test and software applications used on the waveform digitizer with EBS tubes are usable on the waveform digitizer with the coupled scalers and ADC's between the analog input interface and digital output interface.

8. The method of claim 1, further comprising determining the scalers and ADC's to couple to the analog input interface and digital output interface such that the scalers and ADC's provide the same function as the EBS tubes.

9. The method of claim 1, wherein the waveform digitizer with the coupled scalers and ADC's between the analog input interface and digital output interface is functionally equivalent to the waveform digitizer having the EBS tubes.

10. The method of claim 1, wherein the functionality of the waveform digitizer with the coupled scalers and ADC's between the analog input interface and digital output interface is substantially the same as the functionally of the waveform digitizer having the EBS tubes.

11. A method for modifying a waveform digitizer having an analog input interface, a digital output interface and Electron Bombarded Semiconductor (EBS) tubes interposed between the analog input interface and the digital output interface while providing for the same functionality of the EBS tubes, comprising:
  removing the EBS tubes and associated circuitry and componentry between the analog input interface and the digital output interface; and
  coupling scalers and low voltage monolithic analog-to-digital converters (ADCs) to the analog input interface and the digital output interface such that the ADC's are coupled to the same subsystems of the waveform digitizer to which the EBS tubes were connected.

12. The method of claim 11, further comprising connecting each ADC to a respective scaler or to a respective data memory interface.

13. The method of claim 11, further comprising designing the ADCs and associated circuitry to provide on-chip calibration and a built-in testing ability.

14. The method of claim 11, further comprising determining the scalers and ADC's to couple to the analog input interface and digital output interface such that the same test and software applications used on the waveform digitizer with EBS tubes are usable on the waveform digitizer with the coupled scalers and ADC's between the analog input interface and digital output interface.

15. The method of claim 11, further comprising determining the scalers and ADC's to couple to the analog input interface and digital output interface such that the scalers and ADC's provide the same function as the EBS tubes.

16. The method of claim 11, wherein the waveform digitizer with the coupled scalers and ADC's between the analog input interface and digital output interface is functionally equivalent to the waveform digitizer having the EBS tubes.

17. The method of claim 11, wherein the functionality of the waveform digitizer with the coupled scalers and ADC's between the analog input interface and digital output interface is substantially the same as the functionally of the waveform digitizer having the EBS tubes.

18. A method for maintaining operability of a waveform digitizer with the same software while replacing obsolete hardware, the waveform digitizer including Electron Bombarded Semiconductor (EBS) tubes having an analog input interface and a digital output interface and being interposed between the analog input interface and the digital output interface, comprising:
  removing the EBS tubes and associated circuitry and componentry between the analog input interface and the digital output interface;
  coupling scalers and low voltage monolithic analog-to-digital converters (ADCs) to the analog input interface and the digital output interface; and
  determining the scalers and ADC's to couple to the analog input interface and digital output interface such that the scalers and ADC's provide the same function as the removed EBS tubes whereby the same test and software applications used on the waveform digitizer with EBS tubes are usable on the waveform digitizer with the coupled scalers and ADC's between the analog input interface and digital output interface.

19. The method of claim 18, further comprising connecting each ADC to a respective scaler or to a respective data memory interface.

20. The method of claim 18, further comprising designing the ADCs and associated circuitry to provide on-chip calibration and a built-in testing ability.

* * * * *